(12) United States Patent
Meinhardt

(10) Patent No.: US 8,889,303 B2
(45) Date of Patent: Nov. 18, 2014

(54) CASSETTE LESS SOFC STACK AND METHOD OF ASSEMBLY

(75) Inventor: Kerry D. Meinhardt, Richland, WA (US)

(73) Assignee: Battelle Memorial Institute, Richland, WA (US)

(*) Notice: Subject to any disclaimer, the term of this patent is extended or adjusted under 35 U.S.C. 154(b) by 975 days.

(21) Appl. No.: 12/640,280

(22) Filed: Dec. 17, 2009

(65) Prior Publication Data

US 2010/0159300 A1 Jun. 24, 2010

Related U.S. Application Data

(60) Provisional application No. 61/139,427, filed on Dec. 19, 2008.

(51) Int. Cl.
*H01M 8/00* (2006.01)
*H01M 2/08* (2006.01)
*H01M 2/14* (2006.01)
*G01R 33/485* (2006.01)
*G01R 33/48* (2006.01)
*G01R 33/56* (2006.01)
*G01R 33/565* (2006.01)

(52) U.S. Cl.
CPC .......... *G01R 33/485* (2013.01); *G01R 33/5605* (2013.01); *G01R 33/4828* (2013.01); *G01R 33/5607* (2013.01); *G01R 33/56527* (2013.01)
USPC .......................................... 429/400; 429/507

(58) Field of Classification Search
USPC ........................................... 429/30, 400, 507
See application file for complete search history.

(56) References Cited

U.S. PATENT DOCUMENTS

| 4,565,749 | A * | 1/1986 | van Ommering et al. ..... 429/405 |
| 7,306,872 | B2 | 12/2007 | Haltiner, Jr. et al. |
| 2001/0028973 | A1 * | 10/2001 | Ong et al. ........................ 429/30 |
| 2003/0096147 | A1 * | 5/2003 | Badding et al. ................. 429/30 |
| 2005/0048357 | A1 | 3/2005 | Badding et al. |
| 2006/0166053 | A1 * | 7/2006 | Badding et al. ................. 429/13 |
| 2006/0172141 | A1 | 8/2006 | Huang et al. |

OTHER PUBLICATIONS

Das Challenges in Fuel Cell Technology IIT—Delhi Dec. 1-2, 2006 Ceramic Technolgical Institute Bagalore India.*
International Search Report/Written Opinion.

* cited by examiner

*Primary Examiner* — Patrick Ryan
*Assistant Examiner* — Aaron Greso
(74) *Attorney, Agent, or Firm* — A. J. Gokcek

(57) ABSTRACT

A cassette less SOFC assembly and a method for creating such an assembly. The SOFC stack is characterized by an electrically isolated stack current path which allows welded interconnection between frame portions of the stack. In one embodiment electrically isolating a current path comprises the step of sealing a interconnect plate to a interconnect plate frame with an insulating seal. This enables the current path portion to be isolated from the structural frame an enables the cell frame to be welded together.

9 Claims, 2 Drawing Sheets

CASSETTE LESS SOFC STACK AND METHOD OF ASSEMBLY

CLAIM TO PRIORITY

This application claims priority from provisional patent application No. 61/139,427 filed Dec. 19, 2008 the contents of which are herein incorporated by reference.

STATEMENT AS TO RIGHTS TO INVENTIONS MADE UNDER FEDERALLY-SPONSORED RESEARCH AND DEVELOPMENT

This invention was made with Government support under Contract DE-AC0576RLO1830 awarded by the U.S. Department of Energy. The Government has certain rights in the invention.

BACKGROUND OF THE INVENTION

1. Field of the Invention

The invention generally relates to fuel cells and more particularly to Solid Oxide Fuel Cell assemblies.

2. Background Information

Most planar solid oxide fuel cells utilize modular cassette type systems. An example of such a system is found in U.S. Pat. No. 7,306,872. In this configuration sheet metal assemblies having a metal interconnect plate and a metal cell-mounting plate are configured so that when they are joined at their perimeter edges to form the cassette, a cavity between the plates results which can contain a gas stream that feeds a fuel cell subassembly attached within the cassette to the mounting plate. Outside of the fuel cell subassembly, the interconnect plate and cell-mounting plate are perforated by openings to form chimney-type manifolds for feeding fuel gas to the anode and air to the cathode, and for exhausting the corresponding gases from the stack. The fuel cell subassembly is attached to, and insulated from, the mounting plate by an insulating glass seal. The mounting plate includes an opening through which one of the electrodes is accessible, preferably the cathode, and through which a conductive interconnect element extends to make contact with the outer surface of the next-adjacent cassette in a stack. The anode openings in the mounting plate and interconnect plate are separated by spacer rings such that the cassette is incompressible. The rings include openings which allow fuel gas to flow from the anode supply chimney into the anode gas channel in the cassette.

In assembling a fuel cell stack from a plurality of cassettes, the mounting plate of one cassette is attached to, and insulated from, the interconnect plate of the next-adjacent cassette by a peripheral insulating glass seal surrounding the interconnect extending from the mounting plate central opening. Thus, each cassette is at the voltage potential of the adjacent cell in a first direction by virtue of contact with its interconnect, and is insulated from the adjacent cell in the opposite direction by virtue of the peripheral insulating glass seal. Thus, the cassettes are connected in electrical series and the supply and exhaust manifolds are formed inherently by the stack-assembly process.

While this process allows the individual cassettes to be individually tested and exchanged when found to be inoperable. This method and configuration has various problems. First, in order for the device to function, the cassettes must be tested, arranged and sealed together. However failure of the glass seals during thermal cycling is a problem. These glass seals tend to have low bonding strength and are typically located on the perimeter of the cassettes and around the gas porting portions. These areas are also where the maximum stresses typically occur during thermal cycling. In these locations, glass cannot be replaced with a conductive material since its insulative properties are required to prevent the cassettes from shorting. What is needed therefore is a device, system, or configuration that provides for increased strength and durability while maintaining appropriate electrical contact. The present invention provides these advantages.

Additional advantages and novel features of the present invention will be set forth as follows and will be readily apparent from the descriptions and demonstrations set forth herein. Accordingly, the following descriptions of the present invention should be seen as illustrative of the invention and not as limiting in any way.

SUMMARY

The present invention is a cassette less SOFC assembly and a method for creating such an assembly. The SOFC stack is characterized by an electrically isolated stack current path which allows welded interconnection between frame portions of the stack. In one embodiment electrically isolating a current path comprises the step of sealing a interconnect plate to a interconnect plate frame with an insulating seal. This enables the current path portion to be isolated from the structural frame an enables the cell frame to be welded together. In some embodiments an interconnect mesh is positioned within the current path to maintain electrical connections between the cathode/anode and the interconnect This SOFC stack configuration provides electrical isolation of the stack current path from the gas porting, and allows for increased by utilizing a novel configuration wherein an interconnect plate frame part has the porting portions while another part is for electrical conduction (the interconnect). These two parts are bonded together with an insulating seal just like the window frame and the cell of a typical SOCF fuel cell thus separating the stack conduction path from the porting. These preassembled parts can then be laser welded together in a stack, and there is no longer a need to seal the cassettes together with an insulating seal. In as much as these typically fragile areas are welded instead of glass sealed the robustness and strength of the stack is increased. Additionally, the present invention provides consistency in the dimensions of the stack height which does not occur during the prior art glass sealing steps. The result is a cassette less SOFC stack that has superior strength, durability and ease of manufacture compared to other systems that exist in the prior art.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

DESCRIPTION OF THE INVENTION

The following description includes one embodiment of the present invention. It will be clear from this description of the invention that the invention is not limited to these illustrated embodiments but that the invention also includes a variety of modifications and embodiments thereto. Therefore the present description should be seen as illustrative and not limiting. While the invention is susceptible of various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims.

Figure 1:
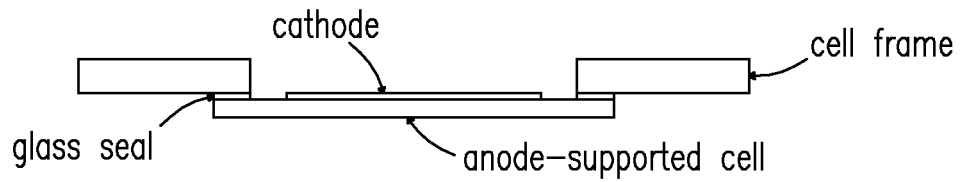
FIG. 1 is a schematic assembly view of a prior art embodiment.
Figure 1:
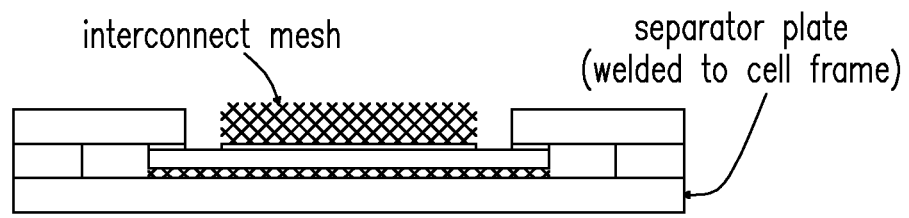
Figure 1:
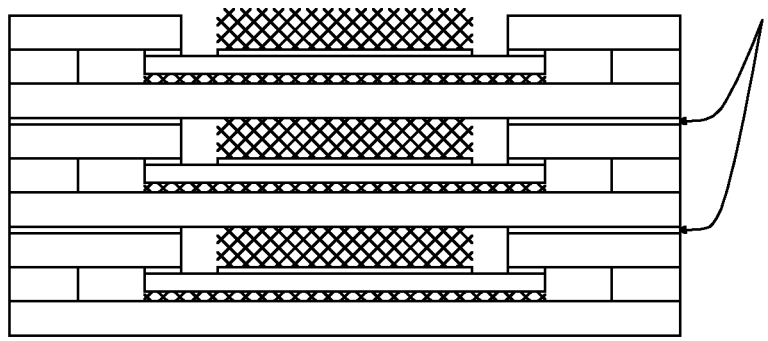

FIG. 1 shows a prior art configuration for an SOFC fuel stack. In such a configuration an anode supported cell is attached to a steel cell frame which is then welded to metal interconnect plate. In use, the entire metal structure is energized to be at the potential of the anode. These individual units or cassettes as they are commonly referred to as are assembled together in repeating units to form a stack to obtain desired performance.

To prevent shorting, these individual metal cassettes must be separated and electrically isolated so as to prevent electrical shorting between the cells. This is typically currently done utilizing bonded glass or compressive insulating seals. However various factors including the shape of these seals, the proximity to the fuel and oxidizer manifolds and the heat and components of the fuel and oxidizer can cause these seals to fail. In addition these seals must serve not only as the insulating means but also as the structural means so as to hold the stack together. Hence strains on the mechanical structural portions of the device can be transmitted to the seals and cause these seals to fail. While a variety of materials and formulations have been attempts it is has been difficult to find materials that perform both of these tasks.

Figure 2:
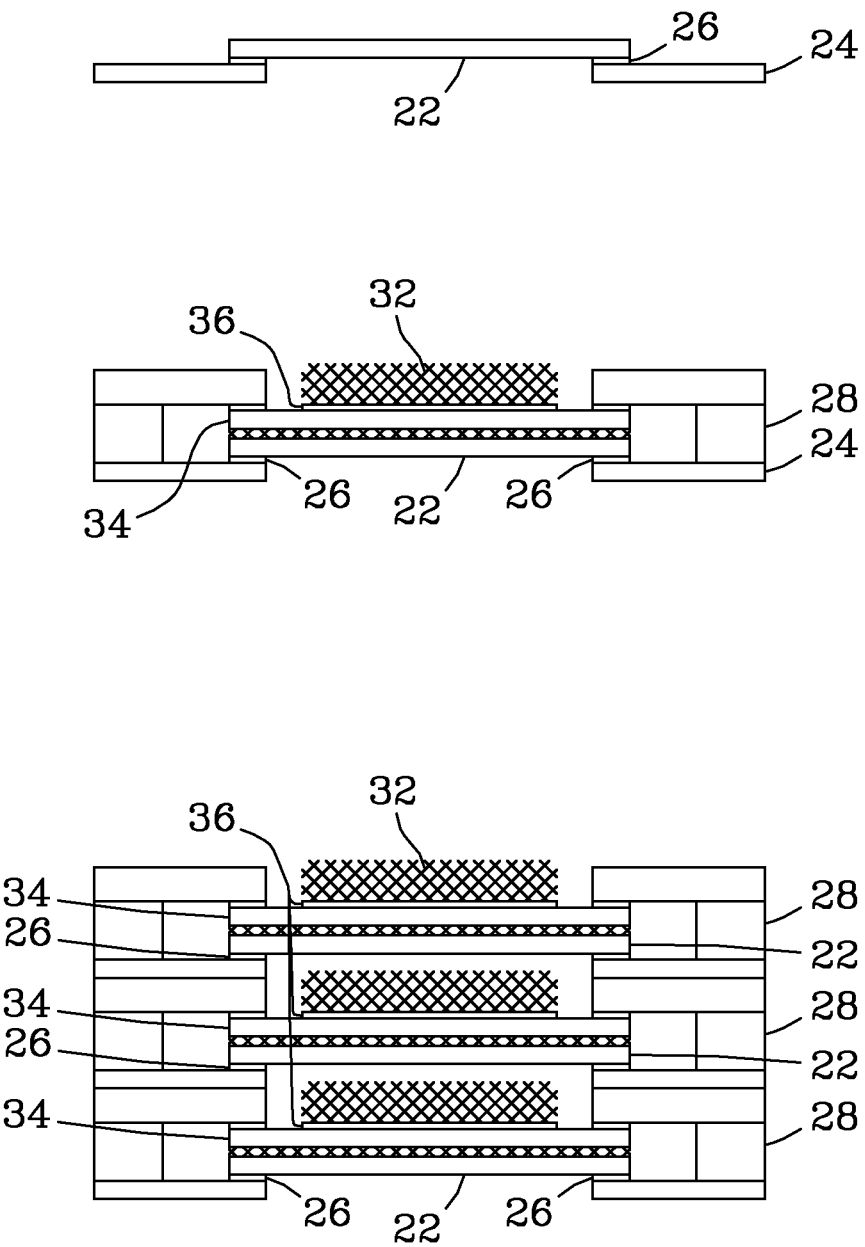
FIG. 2 is a schematic assembly view of one embodiment of the present invention.

FIG. 2 shows the present invention which utilizes an altered configuration which overcomes the disadvantages that exit in the prior art configuration described previously. In this embodiment an interconnect plate 22 is sealed to an interconnect plate frame 24 with an insulating seal 26. Insulated seals 26 (in this case glass but ceramic or other insulative material may also be utilized) ensure that when the interconnect plate is energized that the interconnect plate frame 24 is not energized. Since the interconnect frames 24 are electrically isolated they can be welded to the cell frames 28 directly and there is no need to insert an insulating seal 26 between the portions of the cell frame 28. The cell frames 28 and the interconnect plate frames 24 can thus be directly welded or otherwise permanently connected so as to provide increased structural strength.

Interconnect meshes 32 are also electrically separated from the frame and located within a frame defined window portion so as to maintain appropriate electrical contact between the anode 34 or cathode 36 portions of the cell sections and the interconnect 22 so as to maintain a stack current path 30 and allow the device to operate. While an interconnect mesh 32 s shown and described in the present embodiment, it is to be distinctly understood that the invention is not limited thereto but may be variously alternatively embodied according to the particular needs and necessities of a user.

This configuration provides a variety of advantages over the prior art embodiments. This invention utilizes a significantly smaller amount of electrical insulative seal, positions this sealing material at a location distant from the porting entrances where failure is most likely to occur, and directly welds the frame portions of the fuel cell stack thus providing increased and enhanced structural strength to the overall configuration but also further reduces the stresses and strains on the insulative seal portions of the device. This leads to increased strength and reliability and provides various other advantages over the prior art embodiments.

In this configuration the parts are no longer made into cassettes. The quantity of glass seal area in a stack will be significantly reduced and the seals that do exist are located at a distance from the porting thus decreasing the likelihood of failure. Since most of the high thermal stresses are located near the porting, replacing the glass near the ports with laser welds enhances the robustness of the stack. The new sealing structure creates an all-welded monolithic steel structure surrounding the cells which will be stronger and much less prone to failure than older stack designs. Additionally, this structure and method of fuel stack forming will eliminate the dimension changes in the stack height that occurs during the glass sealing step. While various advantages do exist with this configuration, one drawback is that it is not possible to monitor the individual cell voltages by attaching voltage leads to the exterior of the cells as currently done with stacks formed with cassettes.

While various preferred embodiments of the invention are shown and described, it is to be distinctly understood that this invention is not limited thereto but may be variously embodied to practice within the scope of the following claims. From the foregoing description, it will be apparent that various changes may be made without departing from the spirit and scope of the invention as defined by the following claims.

What is claimed is:

1. A method for constructing a cassette less SOFC stack characterized by electrically isolating a stack current path and frames of the stack; and directly welding the frames of the stack together layer by layer to form the stack.

2. The method of claim 1 wherein said step of electrically isolating a current path comprises the step of sealing a interconnect plate to a interconnect plate frame with an insulating seal.

3. The method of claim 2 wherein said insulating seal is a glass seal.

4. The method of claim 2 further comprising the step of welding said interconnect plate frame to a cell frame.

5. The method of claim 4 further comprising the step of inserting an interconnect mesh within said current path to maintain electrical connection.

6. An SOFC stack characterized by a fuel stack having a welded metal frame defining a stack current flow path having electrically isolated electrical portions positioned therein; wherein individual frames of the stack are directly welded together layer by layer to form the stack.

7. The SOFC stack of claim 6 wherein an interconnect plate within said current flow path is electrically isolated from an interconnect plate frame by an insulative seal.

8. The SOFC stack of claim 6 wherein said electrical portions include anodes and cathodes.

9. The SOFC stack of claim 8 wherein said electrical portions further include interconnected mesh.

* * * * *